(12) United States Patent
Asthana

(10) Patent No.: US 8,767,428 B2
(45) Date of Patent: Jul. 1, 2014

(54) CANARY BASED SRAM ADAPTIVE VOLTAGE SCALING (AVS) ARCHITECTURE AND CANARY CELLS FOR THE SAME

(75) Inventor: Vivek Asthana, Greater Noida (IN)

(73) Assignee: STMicroelectronics International N. V., Amsterdam (NL)

( * ) Notice: Subject to any disclaimer, the term of this patent is extended or adjusted under 35 U.S.C. 154(b) by 326 days.

(21) Appl. No.: 13/172,665

(22) Filed: Jun. 29, 2011

(65) Prior Publication Data

US 2013/0003442 A1 Jan. 3, 2013

(51) Int. Cl.
*G11C 15/00* (2006.01)
(52) U.S. Cl.
USPC ............... 365/49.16; 365/49.17; 365/200
(58) Field of Classification Search
USPC .......... 365/49.11, 154, 156, 206, 200, 201, 365/49.16, 49.17
See application file for complete search history.

(56) References Cited

U.S. PATENT DOCUMENTS

| | | | |
|---|---|---|---|
| 2005/0174868 A1* | 8/2005 | Anzai et al. | 365/210 |
| 2006/0092738 A1* | 5/2006 | Kang et al. | 365/210 |
| 2009/0268531 A1* | 10/2009 | Nii et al. | 365/189.11 |

OTHER PUBLICATIONS

Jiajing Wang, Benton Highsmith Calhoun,"Techniques to Extend Canary-Based Standby VDD Scaling for SRAMs to 45 nm and Beyond", IEEE Journal of Solid-State Circuits, vol. 43, No. 11, Nov. 2008.
Raychowdhury, A. Geuskens, B. Bowman, K. Tschanz, J. Shih-Lien Lu Karnik, T. Khellah, M. De, V., "Tunable Replica Bits for Dynamic Variation Tolerance in 8T SAM", 2010 IEEE Symposium on VLSI Circuits (VLSIC), pp. 39 to 40, Circuits Res. Lab., Intel, Hillsboro, OR, USA.

* cited by examiner

*Primary Examiner* — Hien Nguyen
(74) *Attorney, Agent, or Firm* — Hogan Lovells US LLP

(57) ABSTRACT

A memory bank includes memory cells and an additional cell to determine an operating voltage of the memory bank. The additional cell has an operating margin that is less than a corresponding operating margin of the other memory cells in the memory bank.

17 Claims, 8 Drawing Sheets

CANARY BASED SRAM ADAPTIVE VOLTAGE SCALING (AVS) ARCHITECTURE AND CANARY CELLS FOR THE SAME

FIELD OF THE INVENTION

The present invention relates to a memory bank. Particularly, but not exclusively, some embodiments of the present invention relate to setting an operational voltage for a memory bank.

BACKGROUND OF THE INVENTION

SRAM or cache memory on a system-on-chip SoC may occupy a large portion of the SoC. Typically, this might be between 50 and 60%. Power consumption of the memory in both static and dynamic operation may, therefore, dominate the power consumed by the SoC.

In order to increase power efficiency of the SoC, attempts have been made to reduce SRAM leakage components and dynamic power by power supply Vdd scaling. Dynamic voltage and frequency scaling (DVFS) may also be applied where the system frequency is lowered in the lower voltage operation mode.

However, due to the necessity to perform read and write operations, Vdd scaling during dynamic operation of the memory may be limited by the requirements for performing these operations without error. Vdd scaling during standby or static operation may not be limited by the same constraints as the dynamic operation of the SRAM; however, the power supply reduction may still be limited by a minimum data retention voltage of a SRAM cell.

Designing for these Vdd scaling constraints for a SRAM may be difficult, because the Vdd scaling limits as found on a typical computer-aided design may be pessimistic as compared to the actual conditions of a silicon-implemented SoC. This is because the computer aided design takes into account all of the process, temperature and supply variations, as well as the potential device mismatch.

Finding the Vdd scaling limits on-chip may allow an additional power gain based on the dice specific process, operating temperature and actual power supply variation. However, although such adaptive voltage scaling techniques exist for standard cell logic, there is limited implementation for an embedded SRAM.

IEEE Journal of Solid-State Circuits, Vol. 43, No. 11, "Techniques to Extend Canary-Based Standby Scaling for SRAMs to 45 nm and Beyond", Jiajing Wang, Benton Highsmith Calhoun describes a technique for applying canary-based adaptive voltage scaling to a SRAM.

This canary cell architecture, however, is only proposed for Vdd scaling during a standby mode of the SRAM. Consequently, it does not take into account the constraints imposed by the dynamic read and write operation of a SRAM. The single configuration of canary cells is specifically for detecting a minimum data retention voltage, which is the voltage required for data to be retained in standby mode.

2010 IEEE Symposium on VLSI Circuits (VLSIC), pages 39 to 40, "Tunable replica bits for dynamic variation tolerance in 8T SRAM", Raychowdhury, A. Geuskens, B. Bowman, K. Tschanz, J. Shih-Lien Lu Karnik, T. Khellah, M. De, V. Circuits Res. Lab., Intel, Hillsboro, Oreg., USA describes an 8T SRAM with the inclusion of tunable replica bits.

The tunable replica bits are for a speed of a read '1' operation and a stability of a read '0' operation and are 'tuned' through their scan inputs. The tunable replica bits may be limited in their application.

SUMMARY OF INVENTION

According to a first aspect, there is provided a memory bank comprising: memory cells; and at least one additional cell configured to determine an operating voltage of the memory bank, the at least one additional cell being configured such that at least one operating margin of the at least one additional cell is less than a corresponding operating margin of the memory cells.

An operating voltage of the memory bank may be determined based on a failure of the at least one of additional cell.

The at least one operating margin may be one of a write margin, static noise margin and retention noise margin. The at least one operating margin of the at least one additional cell may be configured to be representative of a corresponding margin for a worst device mismatch of the memory bank. The at least one additional cell may comprise selectively applied masks such that said at least one operating margin of the additional cells is less than the corresponding operating margin of the memory cells. The selectively applied masks may be applied such that a voltage threshold of at least one transistor of the at least one additional cell is less than a voltage threshold of a corresponding transistor in a memory cell.

The at least one additional cell may comprise bias control circuitry for adjusting at least one bias parameter of the additional cells. The bias parameters may be at least one of a supply voltage, a ground voltage, a word-line high level voltage, a bit line discharge voltage and a transistor substrate supply voltage. At least two of the additional cells may be connected in parallel.

According to a second aspect, there is provided a method comprising: setting an operational voltage for a memory bank comprising memory cells and at least one additional cell, at least one operating margin of the additional cell being less than a corresponding margin of a memory cell; said setting comprising: adjusting a supply voltage; carrying out an operation in the at least one additional cell; checking if the operation was carried out successfully; and adjusting the supply voltage if the operation was carried out successfully.

The at least one operating margin may correspond to a likelihood of failure of the operation. The at least one operating margin may be configured to be representative of a corresponding margin for a worst device mismatch of the memory bank. The operating margin may be at least one of a write margin and a static noise margin.

The operation may be one of a read and write. The method may further comprise setting the operational voltage for a dynamic operation of the memory bank. Adjusting the supply voltage may comprise lowering the supply voltage.

According to a third aspect, there is provided a method comprising: setting an operation voltage for a memory bank comprising memory cells and at least one additional cell, at least one operational margin of the at least one additional cell being less than a corresponding margin of a memory cell by; the setting comprising: storing a first value in the at least one additional cell; adjusting a supply voltage; determining a value stored in the at least one additional cell; and adjusting the supply voltage if the determined value is the same as the first value.

The at least one operating margin may correspond to a likelihood of the first value being different to the determined value. The at least one operating margin may be configured to be representative of a corresponding margin for a worst device mismatch of the memory bank. The margin may be a retention noise margin. The method may further comprise setting the operational voltage for a static operation of the memory bank. Adjusting the supply voltage may comprise lowering the supply voltage.

According to a fourth aspect, there is provided a memory bank comprising: data storing means; failure detection means for detecting a failure of the data storing means; and operational voltage determining means for determining an operating voltage of the memory bank; the failure detection means being configured such that at least one operating margin of the failure detection means is less than a corresponding margin of the data storing means.

According to a fifth aspect, there is provided a static random access memory system comprising: a static random access memory comprising: memory cells; and at least one additional cell configured to detect a failure of the memory, the at least one additional cell being configured such that at least one operating margin of the at least one additional cell is less than a corresponding margin of the memory cells; the static random access memory system further comprising: operational voltage determining circuitry comprising: a controller configured to control a voltage regulator based on an indication of a failure of the additional cells from the static random access memory.

DETAILED DESCRIPTION

Some embodiments may relate, but not exclusively to, adaptive voltage scaling techniques implemented on on-chip memory. By way of example only some embodiments may relate to static random access memory SRAM in a system on a chip SoC and canary adaptive voltage scaling applied thereto.

Embodiments may provide adaptive voltage scaling for memory. The memory may be, for example, SRAM or cache memory. The memory may form, for example, part of an embedded system or SoC. In embodiments, adaptive voltage scaling may be applied in a dynamic operation of memory cells. Some embodiments may provide adaptive voltage scaling for dynamic operation of memory cells, static operation of memory cells or dynamic and static operation of memory cells.

Embodiments may provide adaptive voltage scaling through use of additional cells. In some embodiments, the additional cells may be sensor cells for sensing; for example, a feedback to an adaptive voltage controller. In some embodiments, the additional cells may be replica cells for replicating, for example, an operation of memory cells. In some embodiments, the additional cells may be canary cells.

The additional cells may be implemented in a critical path end-point monitoring technique for adaptive voltage scaling. The use of the additional cells may attempt to prevent the occurrence of read or write or hold failures. In some embodiments, a warning may be generated by or in conjunction with the additional cells if there is an impending failure. In some embodiments, the power may then be adjusted to prevent the failure.

In some embodiments, additional cells may be provided for preventing a write margin (WM) failure, a static noise margin (SNM) failure and/or a retention noise margin (RNM) failure of the memory cells. In embodiments, a fixed shift in a margin of an additional cell may be implemented to provide a margin representative of a worst case device mismatch. Some embodiments may be implemented via bias control methods and/or mask management.

Figure 1:
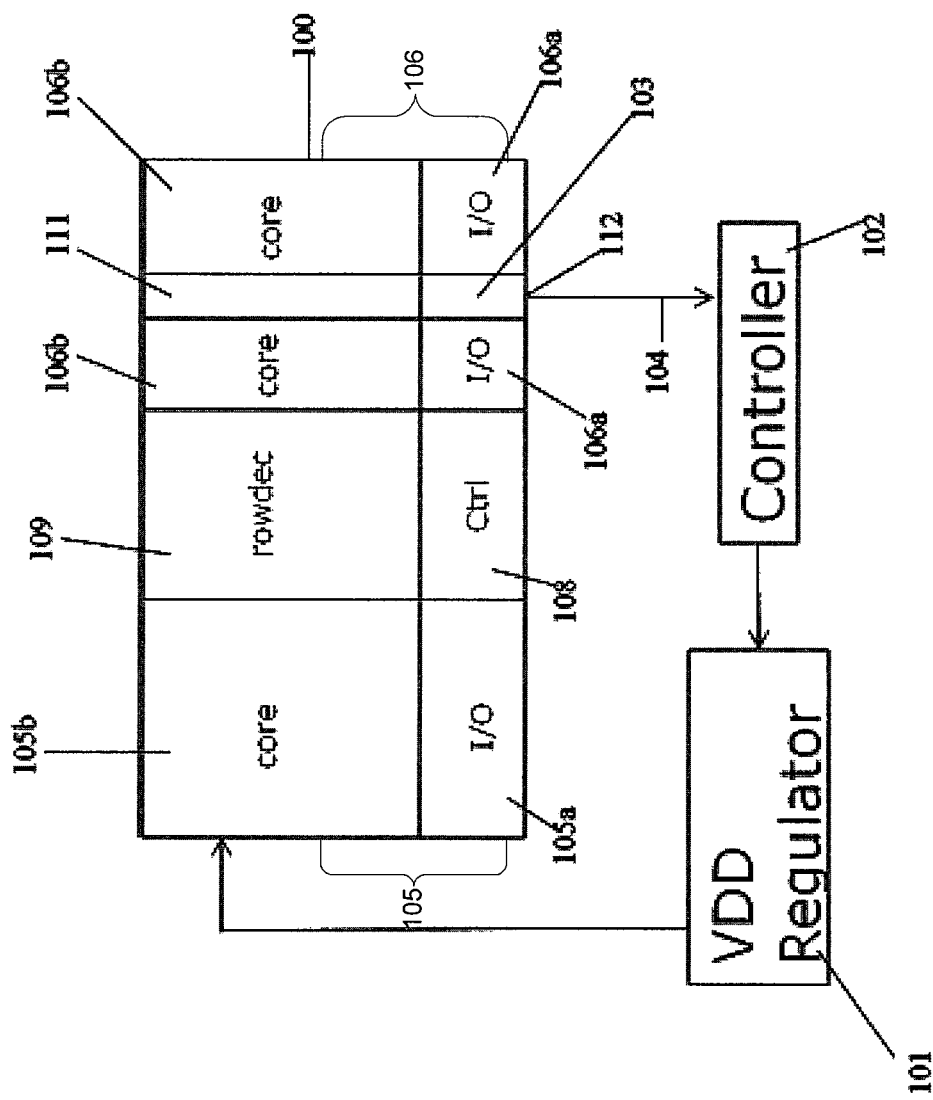
FIG. 1 shows an example architecture of a canary cell bank and associated circuitry.

FIG. 1 shows an adaptive voltage scaling memory implemented in conjunction with an embodiment.

In FIG. 1, a memory bank 100 is provided. In some embodiments, the memory bank 100 may be a split-core SRAM; however, it will be appreciated that this is by way of example only. In this example, the memory may be split into a left memory bank 105 and a right memory bank 106. The left memory bank 105 may comprise core cells 105b and an input/output I/O interface 105a. The right memory bank 106 may comprise core cells 106b and an input/output I/O interface 106a.

Additional cells 111 and a corresponding input/output interface 103 are included in FIG. 1. The additional cells 111 and the corresponding input/output interface 103 may form an additional cell bank 112. In some embodiments, the additional cell bank 112 may be embedded inside the memory in the right memory bank 106 and/or in the left memory bank 105 and/or in other parts of the memory bank 100.

A row decoder 109 and memory bank controller 108 may be implemented in the memory cell bank 100. In some embodiments, the row decoder 109 and memory bank controller 108 may separate the left and right memory bank 105 and 106. The row decoder 109 and memory bank controller 108 may carry out decoding and control operations for the left and right memory banks 105 and 106 and the additional cell bank 112.

The additional cell bank 112 may provide a signal to a voltage controller 102. This may be via the I/O interface 103. The voltage controller 102 may provide a signal to a voltage regulator 101. The voltage regulator 101 may provide power to the memory bank 100 including the additional cell bank 112.

The additional cell bank 112 may comprise several additional cells. In some embodiments, these additional cells may be canary cells. The additional cells may be connected in parallel. In one example, eight to 12 additional cells may be connected in parallel to form the additional cell bank 112. Cell bank 112 is coupled to controller 102 through line 104.

The I/O interfaces 105a, 106a and 103 may provide data to be written to, and/or output data read from, the respective cores 105b, 106b and 111. The core of additional cells 111 may comprise a structure similar to a typical memory cell with modifications as discussed in relation to embodiments.

The voltage regulator 101 may be configured to provide successively lower power to the memory bank 100 comprising the additional cell bank 112. In the embodiment of FIG. 1, the power supplied by voltage regulator 101 may be dependent on the signal from the voltage controller 102. In some embodiments, the voltage regulator 101 may successively reduce the power supplied to the memory bank 100 until an operational level for the additional cells 112 is determined.

The additional cells 111 may be configured such that this operational level corresponds to an operational level of the memory core cells 105 and 106.

Figure 2:
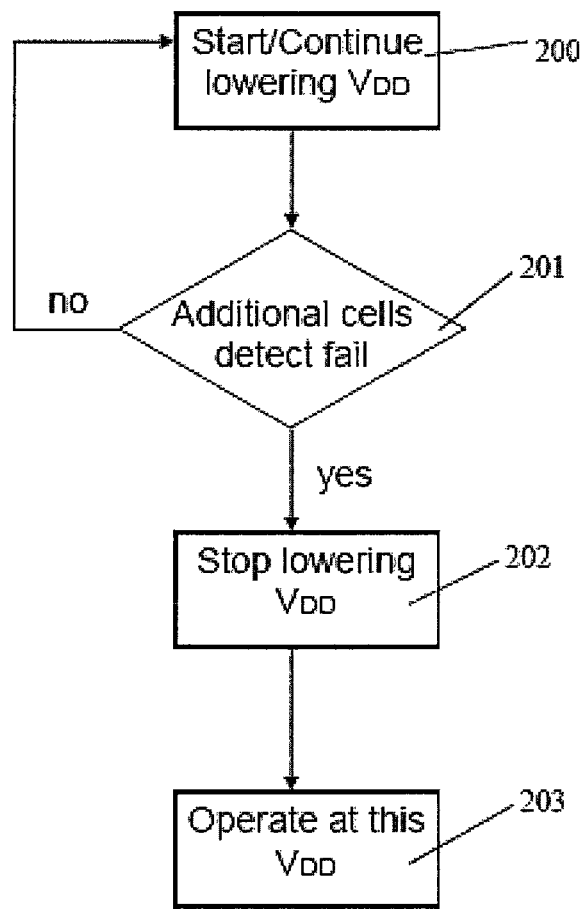
FIG. 2 is a method diagram showing an embodiment of the canary cell bank.

FIG. 2 is a flow diagram showing an embodiment of a method carried out by the canary cell bank and associated circuitry in FIG. 1.

At step 200 in FIG. 2, the power supplied by the voltage regulator 101 is lowered. In some embodiments, the initial reduction of power may be in response to a signal from the voltage controller 102 or from an external signal, for example, a signal indicating that an adaptive voltage scaling mode has been entered.

The additional cell bank 112 may then operate in accordance with the reduced power supplied by the voltage regulator 101. It will be appreciated that in some embodiments, the memory may also be operating in accordance with the reduced power. In some embodiments, the additional cells 111 may carry out a dynamic memory operation such as a read or write operation while being powered by the reduced power. In other embodiments, the additional cells 111 may be in a static or standby operation.

In embodiments, the dynamic operation may be carried out in response to a clock signal. For example, one or more of the additional cells 111 may carry out a write operation in response to each rising edge of the clock signal. Alternatively, or additionally, a read operation may be carried out. Either operation may, alternatively or additionally, be carried out in response to a falling edge of the clock signal. It will be appreciated that this is by way of example only and other operations in response to other parts of the clock signal 110 may be made.

In some embodiments, the memory bank controller 108 may control and set the dynamic operation to be carried out by the memory cells 105b and 106b and the additional cells 111. The row decoder 109 may provide the necessary addressing to select a word line for these cells. The I/O interfaces 105a, 106a and 103 may provide data to the cells.

The operations carried out by the additional cell bank 112 may proceed for a time. In embodiments, this may correspond to a number of operations carried out and/or to a period of time determined by the additional cell bank and associated circuitry. The amount of time may be a self-time period determined by the memory cell bank controller 108.

The additional cells 111 are checked for failure at step 201. This check may occur after the period of time has elapsed. In some embodiments, the checking of the additional cells for a failure is carried out by the I/O interface 103. It will be appreciated, however, that in other embodiments, a failure detector may be provided for detecting the failure. In some embodiments, the failure detector may form part of the I/O interface 103. Alternatively, a check for failure may be carried out by other circuitry, for example, circuitry incorporated into the voltage controller 102.

The failure detector or I/O interface 103 may, for example, monitor whether the memory operation of the additional cell(s) was executed correctly.

A failure may be determined if an incorrect value is written and/or read from the additional cells.

If no failure is detected at step 201, the method returns to step 200 where the power supplied by the voltage regulator 101 may be further lowered. If a failure is detected, the method progresses to step 202.

In embodiments, the additional cell bank 112 may generate a signal indicating that a failure was detected and send this signal to the voltage controller 102. In some embodiments, this signal may be generated by a failure detector. For example, the failure detector may generate or set a flag indicating a failure. Alternatively, a signal may be transmitted to the controller 102. In addition, or alternatively, an indication may be generated when no failure has been detected. In some embodiments, a flag may be raised to indicate that no failure has occurred.

If a failure is not detected, the controller 102 may provide a control signal to the voltage regulator 101 and the power output from the voltage regulator 101 may be further lowered in response to the signal. Alternatively, the voltage controller 102 may provide any suitable signal to indicate that the voltage regulator 101 is to lower the power supply. The method may continue similarly until a failure is detected by the canary cell bank 112.

If a failure is detected, the voltage controller 102 may provide a control signal to the voltage regulator 101 and the voltage regulator 101 may cease to lower the power supply. It will also be appreciated that the voltage controller 102 may provide any suitable signal to indicate that the voltage regulator 101 is to stop lowering power supply.

At step 202, the voltage regulator and voltage controller 102 stop lowering the power supply. The method progresses to step 203 where the additional canary cell bank 112 and associated circuitry then operate in accordance with a power supply level.

It will be appreciated that a detection of a failure may indicate that the current power supply level may be too low for the memory to operate without error. In some embodiments, the power level set at step 203 may be a power level higher than the power level at which the failure occurred. For example, the power level at step 203 may be set at the level of the iteration just previous to the iteration at which failure has occurred. In some embodiments, the power level may be set at a level used with the $n^{th}$ previous iterations where n is greater than or equal to one. Alternatively, x volts may be added to the voltage level at which failure occurred in step 203. In some embodiments, the additional cell(s) may be configured to fail before the memory fails. A failure of the additional cell(s) may then indicate that the voltage at which the additional cell(s) failed is the optimum voltage for the memory cell operation.

In some embodiments, the detection of a failure is used to set an operation voltage of the memory bank.

In the embodiment of FIG. 2, it can be seen that in this manner the power supplied by the voltage regulator 101 is continuously lowered until a failure occurs, which sets the power supply VDD for that memory operation.

It will be appreciated that FIG. 2 is by way of example only. In other embodiments, the method may start at a set low voltage and the voltage regulator 101 may increase the power supplied until it is determined that no error has occurred. Similar adjustments may be made to set an operating voltage, e.g., incrementing the power level by a further n step, wherein n is greater than or equal to one, and/or adding x volts to the failure voltage level.

In embodiments, different additional cells may be implemented for different kinds of failure. For example, additional cells may be implemented for a write failure of the memory. In other words, these additional cells may be designed to detect and provide a warning specifically for an impending failure of a write operation. Other additional cells may be implemented for a read failure of the memory. In other words, these cells may be designed to detect and provide a warning specifically for an impending failure of a read operation. Still other additional cells may be designed for a failure in the storing or holding of data in a memory cell. In other words, these cells may be designed to detect and provide a warning specifically for an impending failure of storage of the data.

The different cells may be incorporated into a single cell bank or may be multiple cell banks.

The dynamic operation carried out in some embodiments with reference to FIG. 2 may correspond to the type of failure the additional cell is designed to detect.

Figure 3:
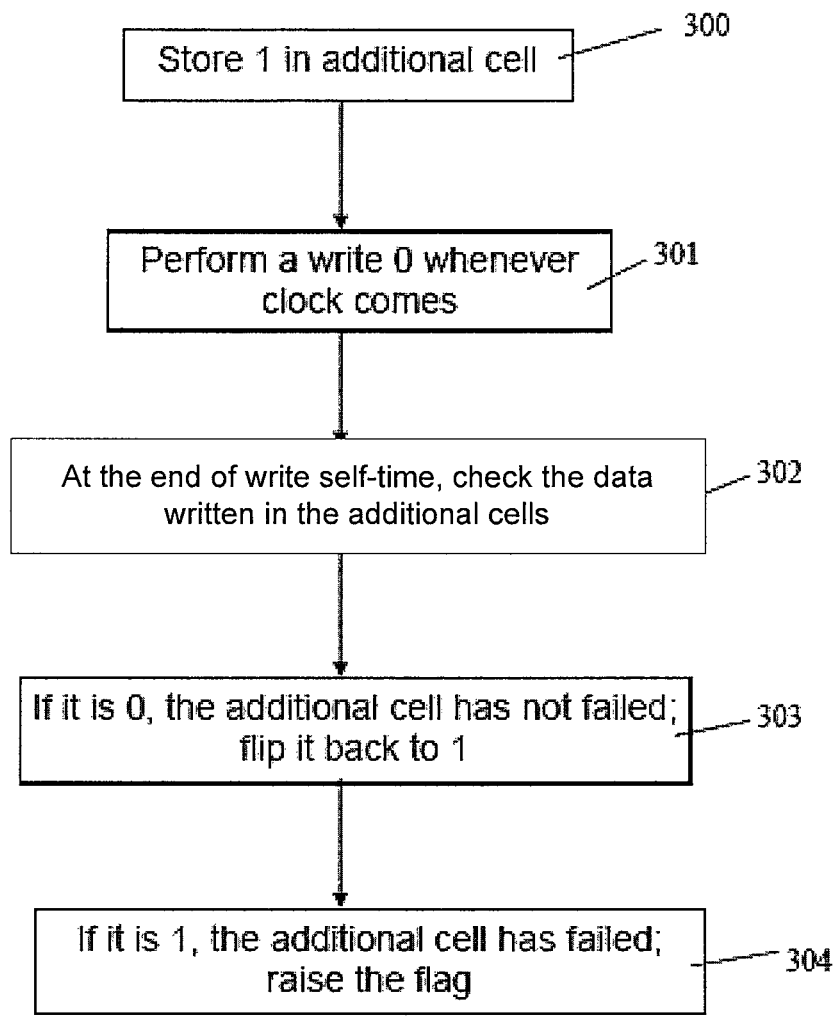
FIG. 3 is a method diagram of an embodiment for a write operation failure detection.
Figure 4:
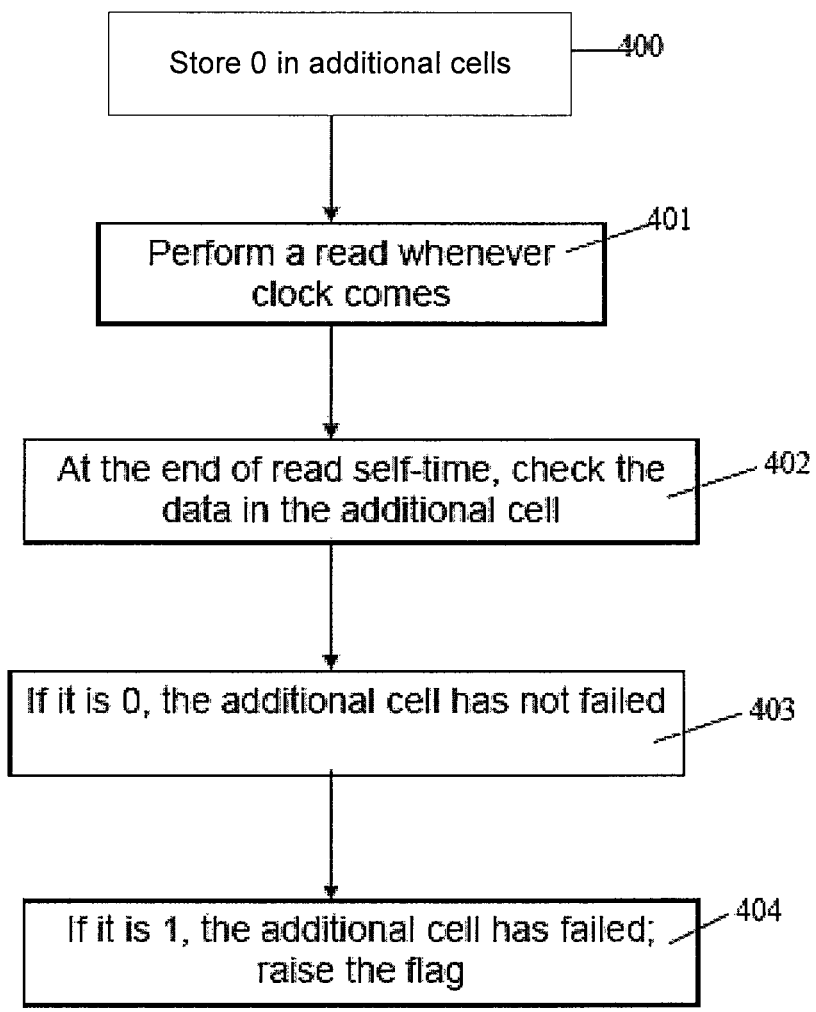
FIG. 4 is a method diagram of an embodiment for a read operation failure detection.

FIGS. 3 and 4 show an example embodiment of the method carried out by additional cells and associated circuitry designed for a write and read failure respectively.

FIG. 3 shows a flow diagram for the functioning of canary cells designed for a write operation failure. It will be appreciated that the memory cell bank 112 may function in accordance with the method of FIG. 2.

Initially a logic is stored in the additional canary cells 111 at step 300.

In some embodiments discussed with reference to FIG. 2, a dynamic operation may be carried out at each clock cycle. In this embodiment, the dynamic operation carried out at step 301 may be a write operation at each clock edge. The write operation may write a logic '0' to each of the additional cells 111. As discussed with reference to the embodiments of FIG. 2, this is performed for a predetermined time period.

At the end of a predetermined time period, a check of the data written in the additional cells is carried out at step 302. This may correspond to step 201 of FIG. 2.

The method then progresses to step 303 where it is determined if the data stored in the additional cells is the same as the data written to the cells. In this example, it is determined if the additional cells are storing a logic '0'. If the data is the same, the additional cells are reset. In this embodiment, this may be done by storing a logic '1' in each additional cell.

At step 304, it is determined if the data stored in the additional cells is different to the data written to the additional cells during the predetermined time period. In this example, it is determined if the additional cells are storing a logic '1'. A stored logic '1' may indicate the writing of a logic '0' during the predetermined time period has failed. In the embodiment of FIG. 3, in response to the determination that the write operation has failed at step 304, a flag indicating the error may be raised.

It will be appreciated that, although FIG. 3 corresponds to an embodiment where a logic '1' is stored and logic '0' is written to the cell, other embodiments may correspond to a logic '0' being stored and a logic '1' being written. It will be appreciated that embodiments may correspond to a value being stored and a different value being written to a cell.

Similarly, FIG. 4 shows a flow diagram for the functioning of additional cells designed for a read operation failure. It will be appreciated that the memory cell bank 112 may function in accordance with the method of FIG. 2.

Initially, a logic '0' is stored in each of the additional cells 111 at step 400.

In some embodiments discussed with reference to FIG. 2, a dynamic operation may be carried out at each clock cycle. In this embodiment, the dynamic operation carried out at step 401 may be a read operation at each clock edge. The read operation may read the data stored in each of the additional cells 111. As discussed with reference to embodiments of FIG. 2, this may be performed for a predetermined time period.

At the end of a predetermined time period, a check of the data in the additional cells is carried out at step 402. This may correspond to step 201 of FIG. 2.

The method then progresses to step 403, where it is determined if the data stored in the additional cells is the same as the data initially written to the additional cells. In this example, it is determined if the additional cells are still storing the logic '0' written to the cells at step 400. If the data is the same, it is determined that the additional cell has not failed. In this embodiment, it is determined that a read '0' operation was carried out successfully.

At step 404, it is determined if the data stored in the additional cells is different to the data initially written to the additional cells at step 400. In this example, it is determined if the additional cells are storing a logic '1'. A stored logic '1' may indicate that the read operation carried out on the additional cells during the predetermined time period was unsuccessful and the data in the cell has changed. In this embodiment, in response to the determination that the read operation has failed at step 404, a flag indicating the error may be raised.

It will be appreciated that, although the embodiment of FIG. 4 stores a '0' initially in a cell, alternatively, a logic '1' may be stored.

In other embodiments, additional cells may be provided to detect a store or retention failure of a memory. A value such as a logic '0' or logic '1' may be stored in the additional cells 111. After a predetermined amount of time has passed, this value may be checked to determine if the additional cells are storing the same value that was written to the cells.

It will be appreciated that the predetermined time may be the same time for a write or read failure or may be a period of time specific to a retention or store failure.

The predetermined time period may be determined by a self-time period of the core cells 105b and 106b of the memory bank 100.

A memory bank 100 may incorporate 'self-time' circuitry into the internal memory circuitry. The self-time circuitry may control timing independently of the externally generated clock signal in that it may establish the interval allowed for reading or writing the contents of the memory locations, together with the subsequent pre-charge interval. The self-time circuitry may, for example, include a dummy memory path for estimating the time required for a read or write operation.

In some embodiments, step 301 and/or step 401 may be carried out during this self-time period for the core cells 105b and 106b.

The self-time period may be specific to the operation carried out. For example, in some memories, a self-time period for a read operation may be longer than a self-time period for a write operation. In some embodiments, the predetermined periods for respective operations may correspond to the self-time periods associated with those respective operations. In other embodiments, the predetermined time period may be chosen as the longer of the self-time periods.

It will be appreciated that some or all the additional cells may be checked and an error in any of them may result in a flag being raised. Alternatively, a flag may be raised only if it is determined that there is an error in some or all of the additional cells.

In some embodiments, the internal nodes of all the additional cells may be shorted together. In this case, the additional cells may toggle together. This may reduce the effect of device mismatch on individual additional cell transistors. In this embodiment, a detected failure may indicate that all the additional cells have failed together and a flag may be raised.

In other embodiments, for example, the internal nodes may not be shorted. Each additional cell may be checked for error individually. In this embodiment, an error flag may be raised if an error is detected in more than a predetermined number of additional cells. For example, a failure in a single additional cell may result in a flag being raised. In another example, a failure may be detected in a majority of additional cells before a flag is raised.

Thus, in some embodiments, additional cells are provided which mimic the operation of the memory cells 105b and 106b. In this manner, the additional cells may be used to determine when a failure will occur in corresponding memory. This may allow voltage to be scaled on-chip with the additional cells providing an indication of the effect of the voltage scaling on operation of the memory.

Figure 5:
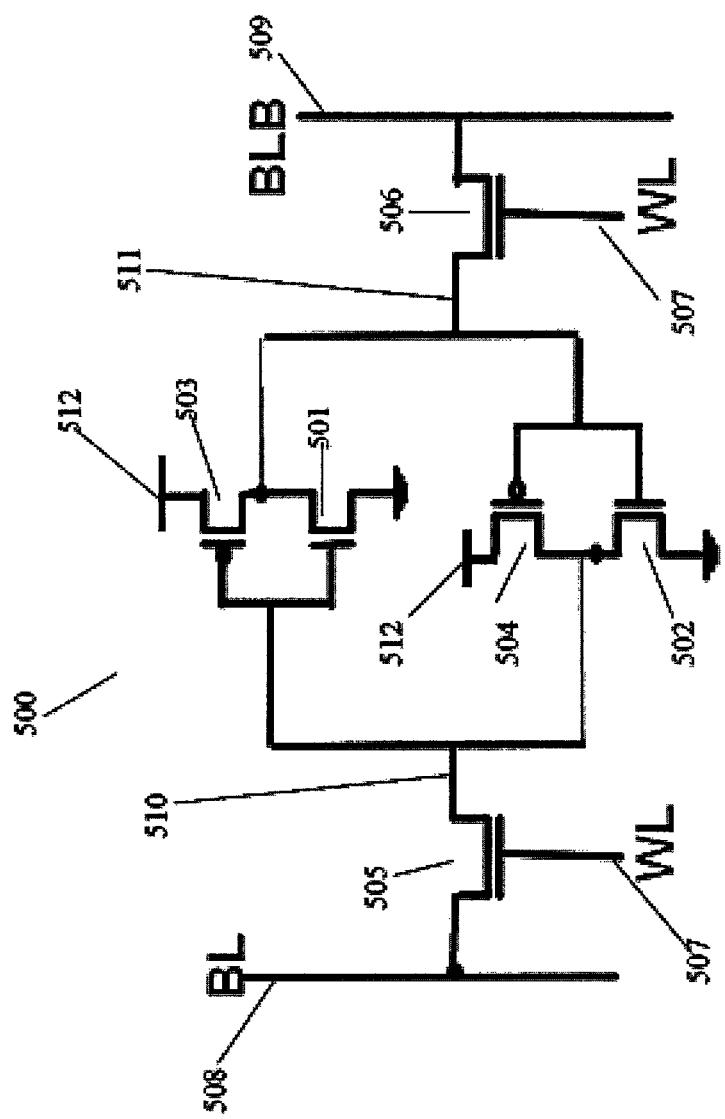
FIG. 5 shows a structure of an embodiment of a canary cell.

FIG. 5 shows an example of a structure of an additional cell. It will be appreciated that a corresponding memory cell may have similar structure. It will be appreciated that the structure of the cell is given by way of example only and other structures of cells is possible.

The additional cell 500 of FIG. 5 has a first and second NMOS transistor 501 and 502 and a first and second PMOS transistor 503 and 504 connected to form a latch for storing data. A first and second NMOS pass transistor 505 and 506 is controlled by a word line WL 507 to pass a value on a bit line BL 508 and complement bit line BLB 509 to the latch at points 510 and 511 respectively. The first and second PMOS transistors 503 and 504 may be connected to a power supply at 512 at their source terminals.

To perform a write operation, BL 508 and BLB 509 are charged with the value to be stored in the memory. For example, to store a logic '0', BL 508 will be set to '0' and BLB 509 set to '1'. When WL 507 is made high, the pass transistors 505 and 506 are opened and the required data is latched into the circuit.

For a read operation, BL 508 and BLB 509 are pre-charged to a logic '1'. WL 507 is set to open the pass transistors 505 and 506 and the stored value of the cell is output to BL 508 and BLB 509.

The points 510 and 511 may be considered internal nodes of the memory cell 500.

In embodiments, the operational power provided by a power supply must ensure that signals to the memory or additional cell are within certain margins in order for operations of the cell to be carried out successfully.

A memory cell, for example, the cell of FIG. 5, may be designed with failure thresholds representing a maximum or minimum value of a signal for a successful operation of the memory cell. If the signal exceeds the threshold, for example, if it is higher or lower than the threshold, an operation may fail.

The difference between the signal and the threshold may be a margin for that signal. The margin may allow that non-ideal behavior or operating conditions of a physically implemented memory cell are taken into account. For example, a value of a signal or threshold may change under different operating conditions and/or may change due to manufacturing conditions. Memory cells may be designed with large enough margins under ideal conditions so that when the signal or threshold take on a non-ideal value, the operation may not fail.

A memory cell may have, for example, a write margin (WM), a static noise margin SNM and a retention noise margin RNM.

The write margin WM may correspond to a maximum threshold of a bitline BL voltage level which results in writing a logic '0' to a memory cell. To write a logic '0' the bitline BL may be pulled to ground and the WM may indicate a margin of bitline BL signal above the ground level for a successful write operation. In other words, the WM may be the range of voltages between the bitline signal and a failure threshold for the bit line.

A static noise margin (SNM) may correspond to an amount of static noise on internal nodes of a memory cell that can flip the data in the cell when the word-line is selected. The SNM may indicate the difference between an internal node voltage and a threshold of that voltage for flipping the data in the memory cell. The SNM can be seen as a measure of the memory or canary cell tolerance of external DC noise. A SNM may allow for external DC noise to be added to the voltage at the node as long as the resultant voltage at the node is lower than the node threshold. The larger the margin the more external DC noise can be tolerated. If the external DC noise is greater than a SNM, the state of a canary or memory cell may change and data can be lost.

A retention noise margin (RNM) represents a SNM with word-line not selected. In other words, the RNM represents a difference between voltages on the internal nodes and a failure threshold for those voltages when the memory cell is retaining data.

A write operation error may correspond to a write margin (WM) failure. In other words, the write margin was so small that the threshold is exceeded. A read operation error may correspond to a static noise margin failure (SNM), and a data retention error may correspond to a retention noise margin (RNM) failure. This may be, for example, when an amount of external DC noise on an internal node exceeds the threshold allowed for the node.

Different margin failures may occur under different modes of operation and embodiments may be implemented for dynamic and/or static modes of operation of the memory cells.

The additional cells may be implemented in conjunction with memory cells, such as memory bank of FIG. 1, for example, in order to predict failures of the memory cells. These failures may be, for example, write failures, read failures and/or data retention failures. The additional cells may, therefore, be implemented to be as similar as possible to the memory cells.

In some embodiments, the additional cells may be manufactured to mimic the memory cells as closely as possible and have the same or similar structure to the memory cells. For example, a cell layout and transistor sizes of an additional cell may match a cell layout and transistor sizes of a corresponding memory cell. This may allow lot or global variations of the components to be minimized. The same supplies and manufacturing environment may be shared for both memory cells and additional cells. The additional cells and memory cells may be subject to the same layout environment, the same supplies and the same timing sequence to attempt to minimize differences.

However, although memory cells and additional cells may be subject to similar global variations, the cells may exhibit localized variations leading to device mismatch. While the additional cells may be subject to the same process, temperature, and supply voltage variation as the memory cell, a device mismatch may be individual to each cell.

The margins of a memory cell may, therefore, be different to the margins of an additional cell even though the cells may have been manufactured to be as similar as possible. This may lead to a situation where a memory cell fails when an additional cell does not.

Additional cells of embodiments may take into account this device mismatch. In some embodiments, the additional cells may be adjusted to exhibit margins corresponding to a worst-case device mismatch.

In some embodiments, additional cells for each type of failure may correspond to a margin associated with that failure. The additional cells may be adjusted to have that margin correspond to a worst-case device mismatch. For example, embodiments may provide additional cells to detect a write margin failure having write margins adjusted corresponding to a worst device mismatch, additional cells to detect a static noise margin SNM failure having SNM adjusted corresponding to a worst device mismatch SNM, and additional cells for a RNM failure having RNM adjusted corresponding to a worst device mismatch.

The margins of additional cells may be adjusted by, for example, mask management and/or bias control.

Mask management may affect masks applied to an additional cell in order to adjust a margin of that cell.

Some special masks may be applied after or during the manufacture of a SRAM cell in order to improve leakage and stability of that cell. For example, a Vt (voltage threshold) adjust implant, a halo adjust implant and/or a lightly doped drain LDD adjust implant may be applied to a memory cell.

These masks may be applied to SRAM bitcell MOS transistors in addition to masks used for processing logic MOS transistors. The purpose of these applied masks is to adjust a voltage threshold Vt of the bit cell transistors in order to reduce a leakage and center the memory cell for better stability margins. In other words, the masks may be applied to improve the margins provided by the cell.

In some embodiments, applying these special masks differently to the additional cells as compared to a memory cell may correspond to degradation in different margins of the additional cell compared to the memory cell. In some embodiments, the masks may be selectively removed. The selective removal of masks or selective application of masks may reduce a margin of a mask managed cell. In other words, a mask managed cell may exhibit a lower margin than a memory cell with the masks applied. In some embodiments, this may be due to the stabilizing influence of the mask being absent for a margin.

In some embodiments, masks may be applied to the memory cell while only some of those masks may be selectively applied to the additional cell during the manufacture of a memory cell and corresponding additional cell. For example, an embedded memory circuitry may have memory cells with a certain mask applied and additional cells without that mask applied. Masks may be selectively applied to an additional cell and a memory cell such that a margin of the additional cell is less than the same margin of a memory cell. The additional cell margin may correspond to a margin of a memory with worst device mismatch.

For example, additional cells for write failure detection may have masks selectively applied or removed such that a write margin of the additional cell is lower than a write margin of a corresponding memory cell. Similarly, additional cells for read failure detection may have masks selectively applied or removed such that a read margin of the additional cell is lower than a read margin of a corresponding memory cell. Similarly, additional cells for data retention failure detection may have masks selectively applied or removed such that retention noise margin of the additional cell is lower than a retention noise margin of a corresponding memory cell.

Figure 6:
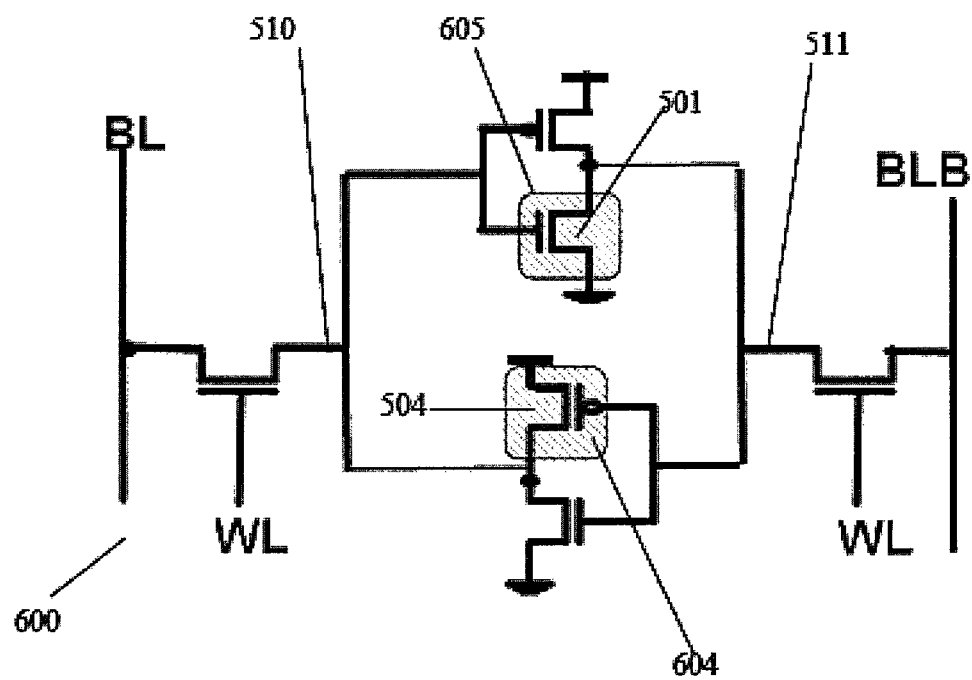
FIG. 6 shows an embodiment of mask management.
Figure 7:
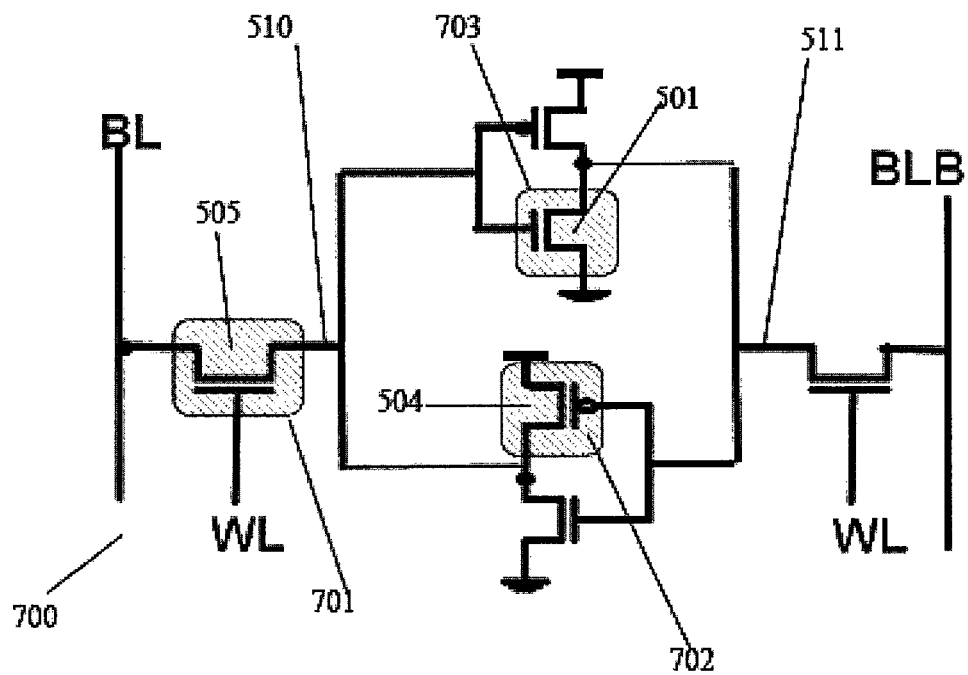
FIG. 7 shows a further embodiment of mask management.

FIGS. 6 and 7 are examples of mask management applied to the additional cell of FIG. 5.

FIG. 6 shows an example of mask management for additional cells for a write failure detection. The additional cell of FIG. 6 may have similar structure to the cell of FIG. 5. Mask management may be applied to the additional cell of FIG. 6 such that a WM of the additional cell undergoes a fixed shift. By providing a fixed shift in the WM, a mask managed additional cell may be closer to failure for a write operation than a corresponding memory cell.

FIG. 6 shows an example of a write margin mask managed additional cell. In the embodiment of FIG. 6, a logic '1' is input to the latch at point 510 and a logic '0' is input to the latch at point 511. This may correspond to initializing the additional cell to store a '1' as per step 300 of the method of FIG. 3.

In FIG. 6, one or more of the Vt adjustment masks 604 may be removed from transistor 504 (the PMOS latch transistor holding a logic '1'). Similarly, one or more of the Vt adjustment masks 605 may also be removed from transistor 501 (the NMOS transistor holding a logic '0').

Removing one or more of these masks will lower the Vt of a particular MOS transistor making it faster. So masks are removed from certain transistors so that, due to lowering of their Vt, the additional cell becomes less writable.

In this embodiment, the removal of masks from the transistors 504 and 501 may make the transistors 504 and 501 more difficult to switch from their initial values. In other words, it is more difficult to carry out a write '0'. The PMOS transistor 504 will be stronger, in other words, providing more resistance against node 510 going low. The NMOS transistor 501 may also be stronger, in other words providing more resistance against node 511 going high. This may increase the chance of a write '0' failure, for example, in step 304 of FIG. 3.

The removal of masks 604 and 605 may result in a write margin of the additional cell 600 being shifted. In other words, with the removal of masks 604 and 605, the cell 600 may be more likely to fail in a write operation with a reduced supply voltage. In this embodiment, the removal of masks 604 and 605 may result in a fixed shift in the write margin of the cell 600.

FIG. 7 shows an example of mask management for additional cells for a read failure detection. The additional cells of FIG. 7 may have similar structure to the cells of FIG. 5.

FIG. 7 shows an additional memory cell 700 designed for SNM failure. In the embodiment of FIG. 7, a logic '0' is read from the latch at point 510 and a logic '1' is read from the latch at point 511. This is in accordance with a logic '0' being initially written to and stored in the data latch as per steps 400 and 401 of FIG. 4.

In FIG. 7, one or more of the Vt adjustment masks 702 may be removed from transistor 504 (the PMOS latch transistor holding a logic '1'). Similarly, one or more mask 703 may also be removed from transistor 501 (the NMOS transistor holding a logic '0') and one or more mask 701 may be removed from the access transistor 505 connected to the BL.

The removal of one or more of these masks may lower a Vt of the corresponding MOS transistor. This may cause the transistor to switch more easily than a transistor with the mask. The removal of the mask 701 may decrease the resistance of the transistor 501 and the voltage of the stored '0' may be higher due to the removal of mask 701. The additional cell may, therefore, become more prone to flipping to '1' on node 510 and '0' on node 511.

The removal of masks 701, 702 and 703 may result in a read margin of the additional cell 700 being shifted. In other words, with the removal of masks 701, 702 and 703, the cell 700 may be more likely to fail in a read operation with a reduced supply voltage. In this embodiment, the removal of masks 701, 702 and 703 may result in a fixed shift in the static noise margin of the cell 700.

In some embodiments, mask management may be applied to additional cells for detecting a failure in a static operation of a memory. These cells may be mask managed to detect a retention noise margin failure. Mask management, in accordance with this embodiment, may be similar to mask management for a read operation failure as shown in FIG. 7.

For example, additional cells for a retention noise margin failure may remove a mask from the PMOS latch transistor

504. A mask may also be removed from transistor the NMOS transistor 501 and a mask may be removed from the access transistor 505 connected to the BL.

It will be appreciated that the foregoing is by way of example only and mask management may be applied according to reading and writing different values. For example, if a method corresponding to that of FIG. 3 was carried out but with the initial value of '0' and writing a '1', different masks would be removed from the cell of FIG. 6. For example, removing a mask from the PMOS latch transistor holding a logic '1' and NMOS transistor holding a logic '0' would result in masks being removed from transistors 503 and 502 in this case. Similarly, mask management may be applied in dependence on the value being written to and/or read from the additional cells. In some embodiments, only cells corresponding to reading and/or writing one value may be provided. In other embodiments, cells corresponding to reading and/or writing a '0' and cells corresponding to reading and/or writing a '1' may be provided.

In addition or alternatively to mask management, a fixed shift in a margin may be created using bias control methods.

Bias control methods may alter the bias parameters of an additional cell to bring it closer to failure. In some embodiments, a failure threshold of an additional cell may be altered such that the difference between the threshold and a signal is reduced. Alternatively, a signal of the additional cell may be altered to be closer to the failure threshold for that signal. In either case, a margin may be lowered to bring the additional circuit closer to failure.

The bias parameters may be, for example, in some embodiments, a power supply, a ground voltage, a charge on a word line, a charge on a bit line, and/or a power supply to an n-well substrate of a PMOS transistor of the additional cell.

In one embodiment, a power supply may be adjusted to lower a write margin of an additional cell. This may bring the additional cell closer to a write failure.

For example, the supply voltage may be increased to cause an additional cell to be less writable. Referring to FIG. 5, if additional cell 500 was storing a logic "1" which may correspond to step 300 of FIG. 3, transistors 503 and 502 would be off and transistors 501 and 504 would be on. Increasing a supply voltage 512 may increase a minimum voltage required at the gate of transistor 504 to turn transistor 504 off. In other words, writing a logic '0' becomes more difficult because a minimum voltage of BLB line 509 is increased.

Figure 8:
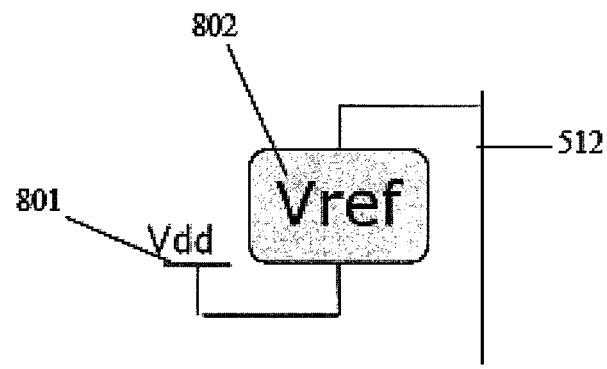
FIG. 8 shows an embodiment of bias control.

FIG. 8 shows an example of a circuit for increasing the voltage supplied to the additional cell.

FIG. 8 has a Vdd connection 801 which may be connected to the voltage regulator 101 output. Vdd connection 801 is connected to a voltage reference circuit 802 which provides a voltage output to line 512. Line 512 may provide a supply voltage to the additional cells 111. The voltage reference circuit 802 may increase the voltage received from Vdd connection 801 and output the increased voltage to line 512, which provides a power supply to the additional cells.

The circuit of FIG. 8 may be part of the memory bank 100 in some embodiments or may be implemented separately in other embodiments. The voltage reference circuit 802 may comprise circuitry operable to increase the voltage supplied by the voltage regulator 101 to the additional cells 111.

In another embodiment of bias control for a write failure additional cell, a bitline discharge may be limited. For example, a bit line may be limited in its discharged value when representing logic '0'. This may lower a write margin of the additional cells and bring the additional cells closer to a write failure.

The value to which the bitline discharge is limited may be determined by a standard deviation in write margin due to device mismatch and the capacity of memory targeted. The value may cause a decrease in a write margin such that the write margin corresponds to a write margin for a worst device mismatch for the targeted capacity of the memory.

For example, when referring to FIG. 5, when writing for example a logic '0' to an additional cell 500, BL is pulled low and BLB is pulled high. A failure threshold of BL may correspond to the maximum voltage of BL for which the cell 500 does not flip its value. By limiting the discharge value of BL, the value of BL is driven towards the failure threshold and a write margin is lowered. In embodiments, the additional cell will therefore undergo a write failure before the memory cell FIG. 9 shows an example of bias control circuit for limiting a discharge of a bit line.

Figure 9:
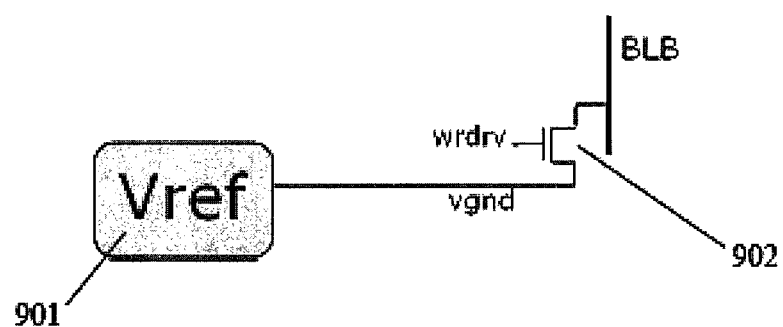
FIG. 9 shows a further embodiment of bias control.

FIG. 9 has a voltage reference circuit 901 connected to a source connection of a first NMOS transistor 902. A drain connector of the first NMOS transistor 902 is connected to bit line 508. A gate connection of the first NMOS transistor 902 is connected to a signal wrdrv.

The wrdry signal may be derived from a clock signal, Write Enable signal or a Data bus signal. It may indicate whether the BL 508 connected to the drain of the NMOS transistor 902 is to be pulled low or high for writing. If a '0' is to be written to the additional cell, the BL 508 is pulled to ground through the NMOS transistor 902. In this embodiment, when the BL 508 is to be pulled low, the NMOS transistor pulls the BL 508 to a reference voltage of BL discharge limit provided by the voltage reference circuit 901.

In another embodiment of bias control for a write failure additional cell, a level of a word-line may be lowered. This may lower a write margin of the additional cells and bring the additional cells closer to a write failure.

For example, during a write operation, in order for an access transistor to turn on when the respective BL or BLB line goes low, the BL or BLB should have a value less than the word-line minus a threshold voltage for the access transistor. If the word-line is lowered, the failure threshold is lowered and the value of the BL or BLB line may be closer to failure.

In another embodiment of bias control for a write failure additional cell, a ground level of the additional cell may be lowered. This may lower a write margin of the additional cells and bring the additional cells closer to a write failure.

For example, referring to FIG. 5, if node 511 is initialized to '1', a lowered ground voltage may make transistors 503 and 502 stronger with increased Vgs. This may make the additional cell less writable for '0' on node 511.

In some embodiments, bias control methods may be implemented to bring an additional cell closer to failure for a read operation. This may be due to a fixed shift in a static noise margin SNM of the additional cell. For example, in some embodiments bias control may be implemented to lower a power supply provided to the additional cell and/or increase a word line 507 high level and/or raise a ground level of the additional cell.

In one embodiment, a power supply may be lowered. For example, referring to FIG. 5, lowering the power supply 512 to additional cell 500 may lower its SNM. In embodiments, this may be due to the p-channel transistor holding '1' switching off more easily due to the lowered supply voltage. The gate overdrive voltage (Vgs) for the NMOS transistor holding '0' may also decrease, making it weaker.

The amount by which the voltage supply may be lowered, may be determined in computer-aided design simulations. This amount may correspond to an amount by which a supply of the additional cell has to be lowered so that its SNM is equal to the SNM of a worst mismatch memory cell having full power supply.

Figure 10:
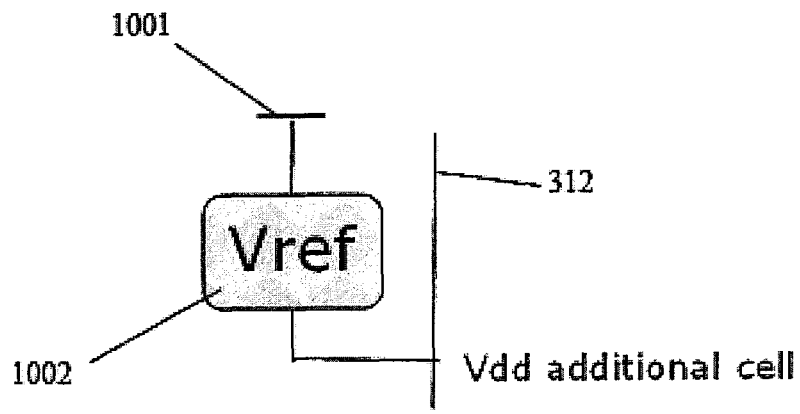
FIG. 10 shows a further embodiment of bias control.

FIG. 10 shows an example of bias control corresponding to lowering a power supply of an additional cell. FIG. 10 provides circuitry for lowering a voltage supplied to the additional cell from a voltage regulator 101. It will be appreciated that similar circuitry to FIG. 10 may be implemented to provide a bias control for a fixed shift in a retention noise margin of an additional cell.

FIG. 10 has a Vdd connection 1001 which may be connected to the voltage regulator 101 output. Vdd connection 1001 is connected to a voltage reference circuit 1002 which provides a voltage output to line 312. Line 312 may provide a supply voltage to the additional cells 111. The circuit of FIG. 10 may be part of the additional cell bank 112 in some embodiments or may be implemented separately in other embodiments. The voltage reference circuit 1002 may be operable to lower the voltage from the voltage regulator 101 supplied to the additional cells.

In another embodiment of bias control for a read failure additional cell, a word line level of the additional cells may be increased. This may lower a SNM of the additional cells and bring the additional cells closer to a read failure.

In this embodiment, the word line may be raised above the supply voltage Vdd. A higher WL voltage may make the access transistor stronger. When the access transistor is turned on, the BL or BLB is discharged, depending on a value being read. The BL or BLB is discharged through the access transistor and transistor pulling the corresponding internal node to ground. A voltage bump may occur on the internal node storing '0' during this discharge due to a resistive divider between the access and pull down transistor during the word line high period. The bump may be increased with the stronger access transistor and the additional cell may be more susceptible to SNM failure.

The WL may be increased by an amount above Vdd corresponding to the SNM of the additional cell being equal to the SNM of a worst mismatch memory cell. The worst mismatch memory cell may have a word line at the power supply voltage Vdd. It will appreciated that, in some embodiments, this amount is determined by computer aided design.

Figure 11:
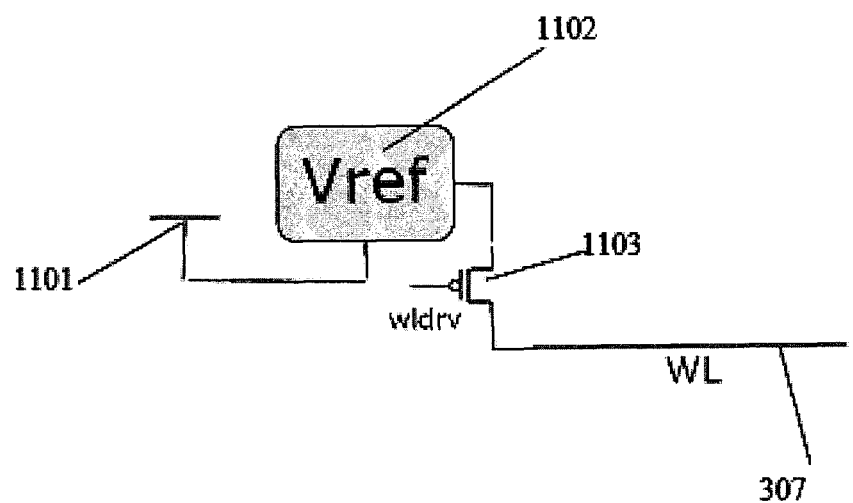
FIG. 11 shows a further embodiment of bias control.

FIG. 11 shows an example of a bias control circuit for providing a fixed shift in a static noise margin of an additional cell by increasing a level of word line 307 high.

FIG. 11 has a voltage reference circuit 1102 connected to a power supply line 1101. Power supply line 1101 may be connected to the output of voltage regulator 101. The voltage reference circuit 1102 may also be connected to a source connection of a first PMOS transistor 1103. A drain connector of the first PMOS transistor 1103 is connected to a word line. A gate connection of the first PMOS transistor 1103 is connected to a wldry signal. The wldry signal may be derived from a clock signal, Read Enable signal and a Address bus signal. It may indicate when the WL 307 is to be pulled high for reading or writing Bias control embodiments may also be implemented with respect to retention failure. This may correspond to a RNM failure. It will be appreciated that similar circuitry may be implemented for a RNM failure as with a SNM margin. For example, bias control may be implemented to lower a supply voltage and/or raise a ground level of an additional cell.

The amount by which a signal is decreased or increased may differ for a read failure and retention failure. In some embodiments, for a fixed shift in a retention noise margin of an additional cell the fixed shift may correspond to a RNM of a worst device mismatch of a memory cell. It will be appreciated that in some embodiments, this amount may be determined using computer-aided design.

It will be appreciated that in embodiments of mask management and embodiments of bias control, a fixed shift in a margin is undergone to bring the additional cell or cells closer to failure than a corresponding memory cell or cells for similar operating conditions. For example, in mask management, the voltage threshold of selective transistors may be changed by the selective application of masks. This may increase a device mismatch of the additional cell. In bias control, operating parameters of the memory bank 100 may be adjusted for an additional cell. The additional cell may operate under worse bias conditions than a corresponding memory cell. The additional cells may be adjusted in these embodiments to have margins representative of a worst mismatch.

In some embodiments, it will be appreciated that a fixed shift in the bias voltage may be achieved using a circuit which generates a process, voltage and temperature independent reference voltage. An example of such a circuit is a bandgap voltage reference circuit.

It will be appreciated that the above circuitry with reference to bias control embodiments may be provided as part of an additional cell bank 112 or implemented separately.

It will be appreciated that embodiments may implement a plurality of additional cell banks, each corresponding to one of a write failure, read fail or a data retention failure. The respective additional cells within the additional cell banks may be modified by a fixed shift in a margin such that their margin is closer to failure than a corresponding memory cell.

In some embodiments, an additional cell bank may correspond to one type of failure. In some embodiments, an additional cell bank may be used both for SNM and RNM failure.

Embodiments provide a fixed shift in a margin of additional cells. In some embodiments this fixed shift is a predetermined value and may be set by the bias control circuitry and/or the mask management. In this manner, the amount by which the margin is shifted may be controlled. In some embodiments, the fixed shift may be controlled so that an optimum adaptive voltage scaling may be carried out.

In some embodiments, a supply voltage of an SRAM under favorable process variations and temperature may operate at, for example, 400 millivolts lower than a supply voltage of an SRAM with worst process variation and temperature.

Some embodiments may show a gain of about 60% in dynamic power and around 40% in static power by allowing the supply voltage on-chip to scale the real minimum required for the dynamic operation.

It will be appreciated that, while embodiments of the foregoing description have referred to memory cells, some embodiments may be applicable to a SRAM and its derivatives. For example, cache, Dual port SRAM, multiport SRAM, CAM and FIFOs.

It will be apparent to those skilled in the art that various modifications and variations can be made to the invention without departing from the spirit or scope of the invention. Thus, it is intended that the present invention covers the modifications and variations of this invention provided they come within the scope of the appended claims and their equivalents.

The invention claimed is:
1. A memory bank comprising:
  memory cells; and
  at least one additional cell configured to determine an operating voltage of the memory bank, the at least one additional cell being configured such that at least one operating margin of the at least one additional cell is less than a corresponding operating margin of the memory cells, wherein an operating voltage of the memory bank is determined based on failure of the at least one additional cell.

2. The memory bank of claim 1, wherein the at least one operating margin is one of a write margin, a static noise margin and a retention noise margin.

3. The memory bank of claim 2, wherein the at least one operating margin of the at least one additional cell is configured to be representative of a corresponding margin for a worst device mismatch of the memory bank.

4. The memory bank of claim 3, wherein the at least one additional cell comprises selectively applied masks such that said at least one operating margin of the additional cell is less than the corresponding operating margin of the memory cells.

5. The memory bank of claim 4, wherein the selectively applied masks are applied such that a voltage threshold of at least one transistor of the at least one additional cell is less than the voltage threshold of a corresponding transistor in a memory cell.

6. The memory bank of claim 1, wherein the at least one additional cell comprises bias control circuitry for adjusting at least one bias parameter of the additional cell.

7. The memory bank of claim 6, wherein the bias parameters are at least one of a supply voltage, a ground voltage, a word-line high level voltage, a bit line discharge voltage and a transistor substrate supply voltage.

8. The memory bank of claim 1, wherein the at least one additional cell comprises at least two of the additional cells connected in parallel.

9. A memory bank comprising:
data storing means;
failure detection means for detecting a failure of the data storing means;
operational voltage determining means for determining an operating voltage of the memory bank; and
the failure detection means being configured such that at least one operating margin of the failure detection means is less than a corresponding margin of the data storing means.

10. A static random access memory system comprising:
a static random access memory comprising:
memory cells; and
at least one additional cell configured to detect a failure of the memory, the at least one additional cell being configured such that at least one operating margin of the at least one additional cell is less than a corresponding margin of the memory cells; the static random access memory system further comprising:
operational voltage determining circuitry comprising:
a controller configured to control a voltage regulator based on an indication of the failure of additional cells from the static random access memory.

11. A memory bank comprising:
memory cells; and
at least one additional cell configured to determine an operating voltage of the memory bank, the at least one additional cell being configured such that at least one operating margin of the at least one additional cell is less than a corresponding operating margin of the memory cells,
wherein the at least one operating margin is one of a write margin, a static noise margin and a retention noise margin.

12. The memory bank of claim 11, wherein the at least one operating margin of the at least one additional cell is configured to be representative of a corresponding margin for a worst device mismatch of the memory bank.

13. The memory bank of claim 12, wherein the at least one additional cell comprises selectively applied masks such that said at least one operating margin of the additional cell is less than the corresponding operating margin of the memory cells.

14. The memory bank of claim 13, wherein the selectively applied masks are applied such that a voltage threshold of at least one transistor of the at least one additional cell is less than the voltage threshold of a corresponding transistor in a memory cell.

15. A memory bank comprising:
memory cells; and
at least one additional cell configured to determine an operating voltage of the memory bank, the at least one additional cell being configured such that at least one operating margin of the at least one additional cell is less than a corresponding operating margin of the memory cells,
wherein the at least one additional cell comprises bias control circuitry for adjusting at least one bias parameter of the additional cell.

16. The memory bank of claim 15, wherein the bias parameters are at least one of a supply voltage, a ground voltage, a word-line high level voltage, a bit line discharge voltage and a transistor substrate supply voltage.

17. A memory bank comprising:
memory cells; and
at least one additional cell configured to determine an operating voltage of the memory bank, the at least one additional cell being configured such that at least one operating margin of the at least one additional cell is less than a corresponding operating margin of the memory cells,
wherein the at least one additional cell comprises at least two of the additional cells connected in parallel.

* * * * *